United States Patent
Yi et al.

(10) Patent No.: US 6,338,987 B1
(45) Date of Patent: Jan. 15, 2002

(54) METHOD FOR FORMING POLYCRYSTALLINE SILICON LAYER AND METHOD FOR FABRICATING THIN FILM TRANSISTOR

(75) Inventors: Jong-Hoon Yi; Sang-Gul Lee, both of Seoul; Won-Kyu Park, Sungnam-si, all of (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/377,440

(22) Filed: Aug. 19, 1999

(30) Foreign Application Priority Data

Aug. 27, 1998 (KR) .............................. 98-34893
Jan. 15, 1999 (KR) .............................. 99-1125

(51) Int. Cl.$^7$ .......................... H01L 21/00; H01L 21/84
(52) U.S. Cl. ...................................... 438/150; 438/488
(58) Field of Search ................... 438/150, 151, 438/154, 966, 153, 502, 488, 506, 491, 96, 97

(56) References Cited

U.S. PATENT DOCUMENTS

| | | | | |
|---|---|---|---|---|
| 4,755,481 A | * | 7/1988 | Faraone | 437/62 |
| 4,814,291 A | * | 3/1989 | Kim et al. | 437/101 |
| 5,508,216 A | * | 4/1996 | Inoue | 437/40 |
| 5,866,471 A | * | 2/1999 | Beppu et al. | 438/502 |

* cited by examiner

*Primary Examiner*—David Nelms
*Assistant Examiner*—David Nhu
(74) *Attorney, Agent, or Firm*—Long Aldridge & Norman LLP

(57) ABSTRACT

A method for forming a polycrystalline silicon layer for TFT according to the present invention includes steps of: depositing an amorphous silicon layer and a silicon oxidation layer on a substrate in this order; and implanting semiconductor ions into the amorphous silicon layer and the silicon oxidation layer while heating the substrate, thereby converting the amorphous silicon layer into a polycrystalline silicon layer, and forming an amorphous oxidation layer between the amorphous silicon layer and the silicon oxidation layer.

18 Claims, 9 Drawing Sheets

METHOD FOR FORMING POLYCRYSTALLINE SILICON LAYER AND METHOD FOR FABRICATING THIN FILM TRANSISTOR

CROSS REFERENCE TO RELATED ART

This application claims the benefit of Korean Patent Application Nos. 1998-34893, filed on Aug. 27, 1998 and 1999-1125, filed on Jan. 15, 1999, which are hereby incorporated by reference.

BACKGROUND OF THE INVENTION

1. Field of the Invention

The present invention relates to a method for forming a polycrystalline thin layer and a thin-film transistor("TFT") for a liquid crystal display device.

2. Description of the Related Art

A thin film transistor for an active matrix liquid crystal display can be classified into an amorphous silicon TFT or a polycrystalline silicon TFT in accordance with the kind of the active layer used therein. The polycrystalline silicon TFT is advantageous in that the surface of a polycrystalline silicon layer has a fewer defects than that of the amorphous silicon, thus the polycrystalline silicon TFT has a faster mobility characteristic.

A conventional method for forming a polycrystalline silicon layer for TFT will be described with reference to FIGS. 1A through 1D. A buffer layer 12 made of silicon oxide is deposited on a substrate 10 as shown in FIG. 1A. Then, an amorphous silicon layer 14 is formed on the buffer layer 12 as shown in FIG. 1B. The amorphous silicon layer 14 is then converted into a polycrystalline silicon layer 14P through a laser annealing process as shown in FIG. 1C. The crystallization is performed from silicon seeds to polycrystalline silicon with plurality of grains 17 and the grain boundaries 19, which protrude from the relatively flat surface of grains 17. The crystallized polycrystalline silicon layer 14P is used as an active layer of TFT. In order to induce electric charges for the active layer of TFT and for the purpose of insulating the active layer from a gate electrode, which will be formed over the active layer, a silicon oxidation layer 16 is formed thereon using PECVD (Plasma Enhanced Chemical Vapor Deposition) or APCVD (Atmosphere Pressure Chemical Vapor Deposition), as shown in FIG. 1D.

The electric characteristics of polycrystalline silicon TFT, e.g. mobility of electric charges and threshold voltage, are affected by density of trap energy states of interfaces 20 between the silicon oxidation layer 20 and the polycrystalline silicon layer 14P. The density of trap energy is affected by excessive heat energy of the annealing process.

One method of reducing density of trap energy states is suggested. Before the laser annealing process, the silicon oxidation layer is deposited on the amorphous silicon layer and oxygen ions are implanted into the amorphous silicon layer. The reaction between implanted oxygen ions and the amorphous silicon atoms forms silicon oxidation layer, which reduce the state density of trap energy of the interfaces.

However, since relatively large oxygen ions are forcibly implanted into the amorphous silicon layer without any chemical reaction, the oxygen ions damage the atom arrangement of the amorphous silicon layer and act as impure elements. The impurities of the interfaces adversely affect the mobility of the electron charges on the surface of the polycrystalline silicon layer and the reliability of the TFT.

SUMMARY OF THE INVENTION

Therefore an object of the present invention is to provide a method for fabricating TFT which can reduce impurities and mismatches between silicon oxidation layer and the polycrystalline silicon layer.

Another object of the present invention is to provide a method for forming a polycrystalline silicon layer which can reduce impurities therein.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

According to one preferred embodiment of the present invention, a method for forming a polycrystalline silicon layer includes the steps of depositing an amorphous silicon layer and a silicon oxidation layer on a substrate in the listed order; and implanting semiconductor ions into the amorphous silicon layer and the silicon oxidation layer while heating the substrate, thereby converting the amorphous silicon layer into a polycrystalline silicon layer, and forming an amorphous oxidation layer between the amorphous silicon layer and the silicon oxidation layer.

During the ion implantation the substrate is preferably being heated at a temperature between 200 to 500° C. The ions for the implantation are preferably chosen from a group comprising of Si (silicon), Ge (germanium), Te (tellurium), Sb (Antimony), As (Arsenic), and Ga (Gallium).

The method further includes the steps of removing the silicon oxidation layer; and annealing the amorphous oxidation layer thereby converting the amorphous oxidation layer into a crystallized oxidation layer.

According to another preferred embodiment of the present invention, a method for fabricating a thin-film transistor includes the steps of: forming an amorphous silicon layer and a silicon oxidation layer on a substrate in the listed order; implanting semiconductor ions into the amorphous silicon layer and the silicon oxidation layer while heating the substrate, thereby converting the amorphous silicon layer into a polycrystalline silicon layer, and forming an amorphous oxidation layer between the amorphous silicon layer and the silicon oxidation layer; removing the silicon oxidation layer; annealing the amorphous oxidation layer thereby converting the amorphous oxidation layer into a crystallized oxidation layer; forming a gate electrode on the crystallized oxidation layer; forming a source region, a drain region, and a channel region in the polycrystalline silicon layer; and forming a source electrode and a drain electrode which contact the source region and the drain region, respectively.

According to another preferred embodiment of the present invention, a method for fabricating a thin-film transistor includes the steps of: forming a source electrode and a drain electrode on a substrate; depositing a first insulating layer on the source and the drain electrodes; forming an amorphous silicon layer and a silicon oxidation layer on the first insulating layer; implanting semiconductor ions into the amorphous silicon layer and the silicon oxidation layer while heating the substrate, thereby converting the amorphous silicon layer into a polycrystalline silicon layer, and forming an amorphous oxidation layer between the amorphous silicon layer and the silicon oxidation layer; removing the silicon oxidation layer; annealing the amorphous oxidation layer thereby converting the amorphous oxidation layer into a crystallized oxidation layer; forming a gate electrode on the crystallized oxidation layer; forming a source region, a drain region, and a channel region in the polycrystalline silicon layer; and forming a first connecting electrode to connect the source region and the source electrode and a second connecting electrode to connect the drain region and the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of the specification, illustrate preferred embodiments of the present invention, and together with the description, serve to explain the principles of the present invention.

DESCRIPTION OF THE PREFERRED EMBODIMENTS

The preferred embodiment of the present invention will be explained with reference to the accompanying drawings.

Figure 1A:
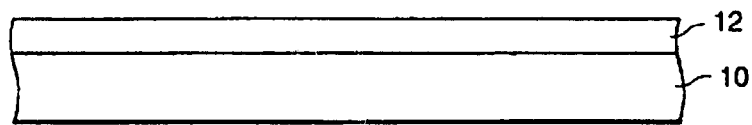
FIGS. 1A to 1D illustrate cross-sectional views of a TFT as it undergoes sequential processing steps for forming a polycrystalline silicon layer on a substrate according to a conventional method.
Figure 1B:
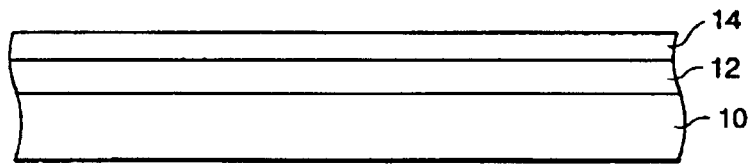
Figure 1C:
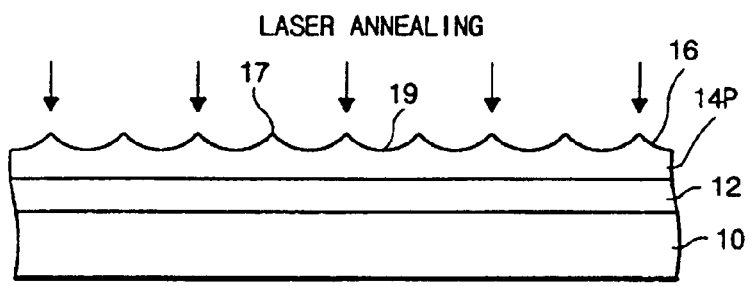
Figure 1D:
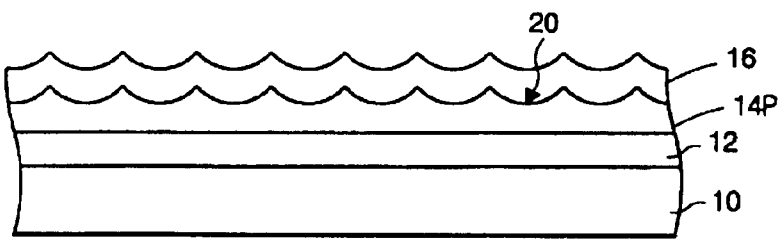
Figure 2A:
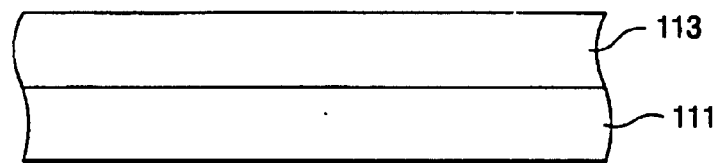
FIGS. 2A to 2E illustrate cross-sectional views of a TFT as it undergoes sequential processing steps for forming a polycrystalline silicon layer on a substrate according to an embodiment of the present invention.
Figure 2B:
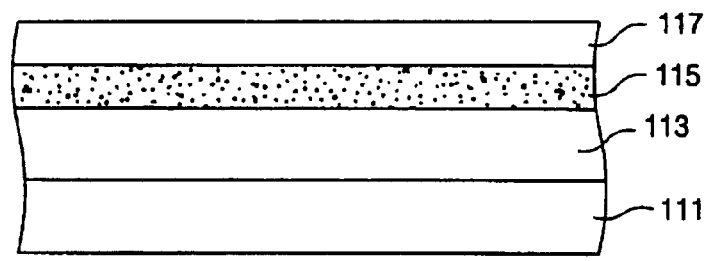
Figure 2C:
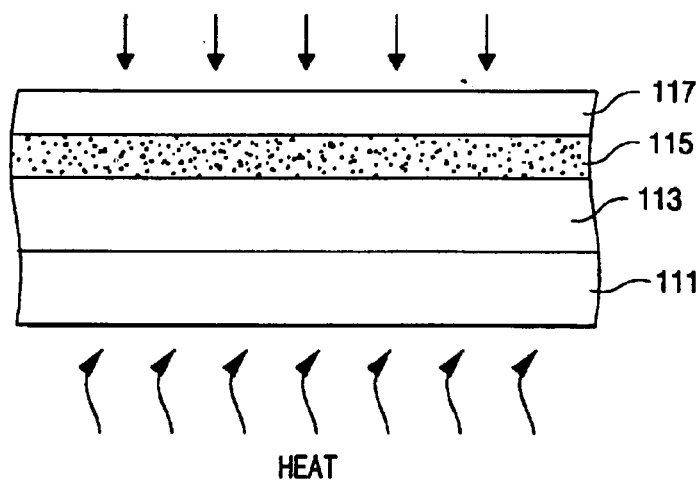
Figure 2D:
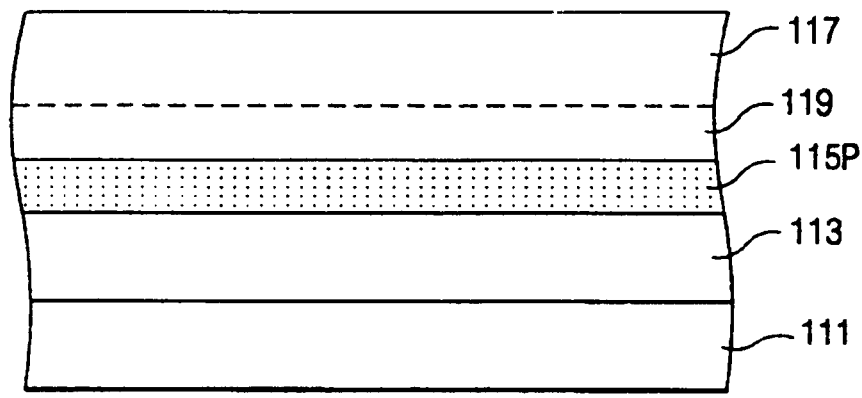
Figure 2E:
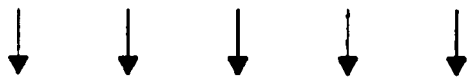
Figure 2E:
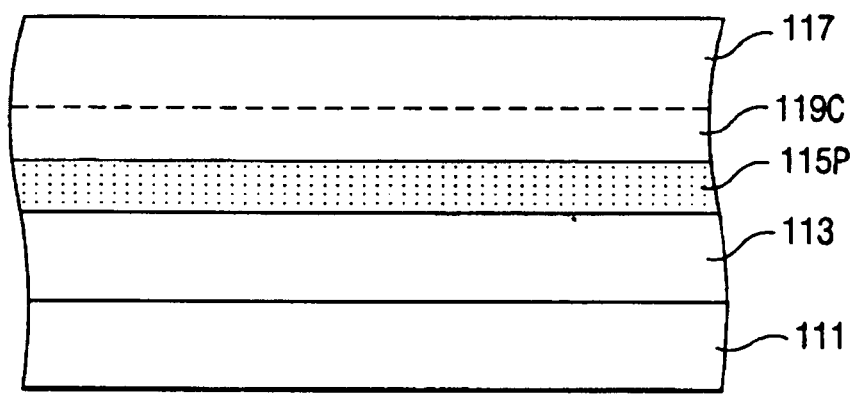

A method for forming a polycrystalline silicon semiconductor layer for, for example, a coplanar-structure TFT according to an embodiment of the present invention is shown through FIGS. 2A to 2E. A buffer layer 113 which is for stress and adhesive strength between the substrate and TFT element is preferably deposited on the substrate 111 as shown in FIG. 2A. Then amorphous silicon layer 115 is deposited on the buffer layer and in succession, the silicon oxidation layer 117 is deposited thereon, as shown in FIG. 2B.

The ions of semiconductor material are implanted into the interface between amorphous silicon layer 115 and silicon oxidation layer 117 while the substrate is heated to about 200 to 500° C. The semiconductor material according to the present invention can be chosen among Si (silicon), Ge (germanium), Te (tellurium), Sb (Antimony), As (Arsenic), Ga (Gallium) or other suitable materials known to one of ordinary skill in the art. The amorphous silicon layer 115 is converted into polycrystalline silicon layer 115P through this process. The lower portion of the silicon oxidation layer 117 is converted into amorphous oxidation layer 119 with the implanted semiconductor ions.

Laser annealing is then performed on the silicon oxidation layer 117. Through the annealing process, the semiconductor ions and the oxygen atoms, which were weakly bonded within the amorphous oxidation layer 119, are rearranged. The amorphous oxidation layer 119 is then converted into a crystallized oxidation layer 119C having a thickness of about 50 to 100 Å, which acts as a gate insulating layer. Moreover, the grain sizes while crystallizing from the amorphous silicon to polycrystalline silicon are enlarged to reach about 4,000 Å, since the amorphous oxidation layer 119 substantially sustains the heat of the laser annealing. Thus, the number of grain boundaries, which adversely affect the state density of the trapping energy for trapping electric charges on the interface between the oxidation layer 119C having semiconductor material therein and polycrystalline silicon layer, is reduced.

Figure 3A:
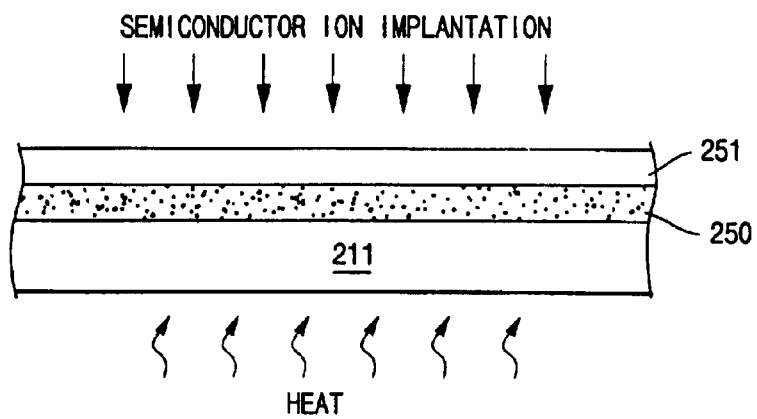
FIGS. 3A to 3H are cross-sectional views showing an example of a method for fabricating a thin film transistor according to the present invention.

A preferred method for fabricating a TFT according to the present invention will be described with reference to FIGS. 3A through 3H. A substrate 211, which is preferably made of glass or other suitable materials, is provided and a buffer layer is formed thereon by depositing an insulating material. In succession, amorphous silicon and silicon oxide are deposited on the buffer layer to form a amorphous silicon layer 250 and silicon oxidation layer 251 as shown in FIG. 3A.

Next, ions of semiconductor material are implanted into the interface between amorphous silicon layer 250 and the silicon oxidation layer 251 while heating the substrate to temperature of of about 200 to 500° C. The ions of the semiconductor material permeate to the projected range while hitting the crystal lattice of the amorphous silicon layer 250.

Figure 3B:
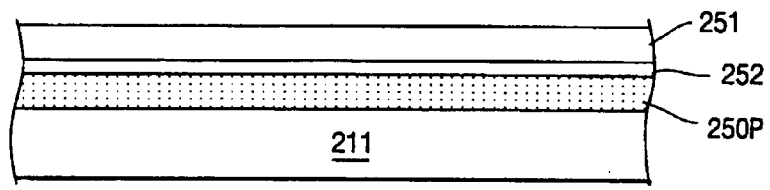
Figure 3C:
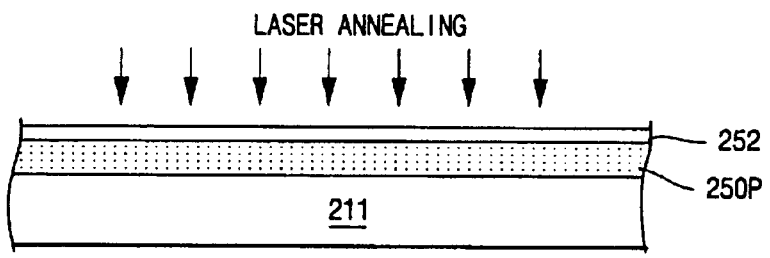

As shown in FIG. 3B, as a result of the ion implantation or impregnation, an amorphous oxidation layer 252 is formed between the amorphous silicon layer 250 and the silicon oxidation layer 251. That is, the structure of two layers of oxidation layer and amorphous silicon layer is changed to the that of three layers of silicon oxidation layer 251-amorphous oxidation layer 252-polycrystalline silicon layer 250P.

At this time, if silicon ions are chosen for the ion implantation, the amorphous silicon layer 252 is SiOx layer, whereas if germanium ions are chosen, it can be SiOx or SiGeOx layer dependent on the heat applied to the silicon oxidation layer during the accelerating ions for implantation or heating the substrate.

The damaged silicon oxidation layer 251 by the ion implantation is etched. After that, a laser annealing process is performed and the implanted semiconductor ions and the oxygen atoms which were weakly bonded with each other in the amorphous oxidation layer 252 are rearranged. That is, the polycrystalline silicon layer 250P and the amorphous oxidation layer 252 are recombined with each other and the number of impurities occurred by the mismatch of the lattices occurred in the interface therebetween is reduced. Also, the heat occurred during the laser annealing process is sustained or maintained by the amorphous oxidation layer 252, thus the size of crystalline grains increases and the number of the grain boundaries is reduced. At this time, the amorphous oxidation layer 252 of SiOx or SiGeOx grows to be $SiO_2$ or $SiGeO_2$ layer through the annealing process, thus it can be used as an insulating layer with rich Si content.

Figure 3D:
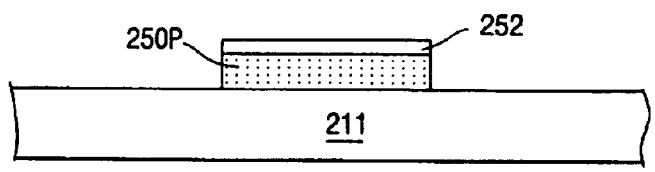
Figure 3E:
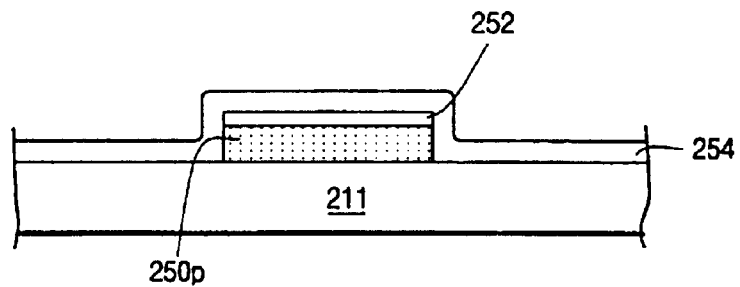

The polycrystalline silicon layer 250P and the silicon oxidation layer 251 are simultaneously etched through a lithography process or other suitable processes to form an active layer and a gate insulating layer, respectively, as shown in FIG. 3D. Next, a gate electrode layer 254 which can be a single layer or double-layer, is formed thereon, as shown in FIG. 3E. The gate electrode layer 254 and the oxidation layer 252 are simultaneously etched through a photolithography process.

Figure 3F:
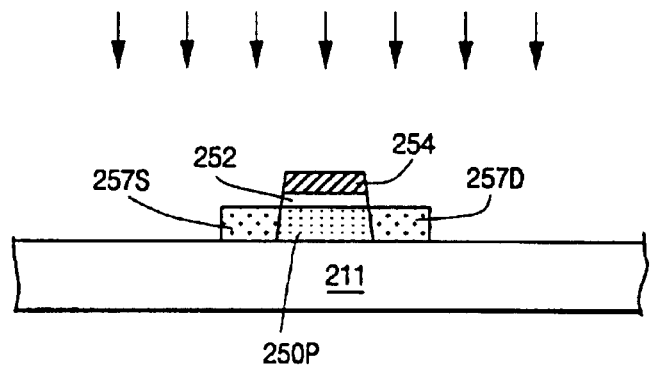
Figure 3G:
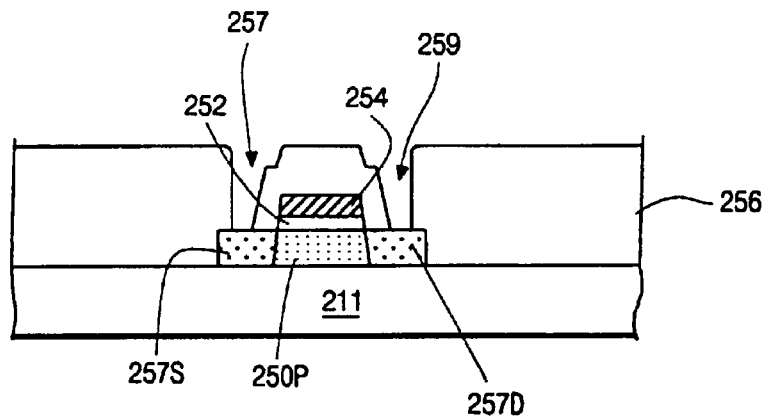
Figure 3H:
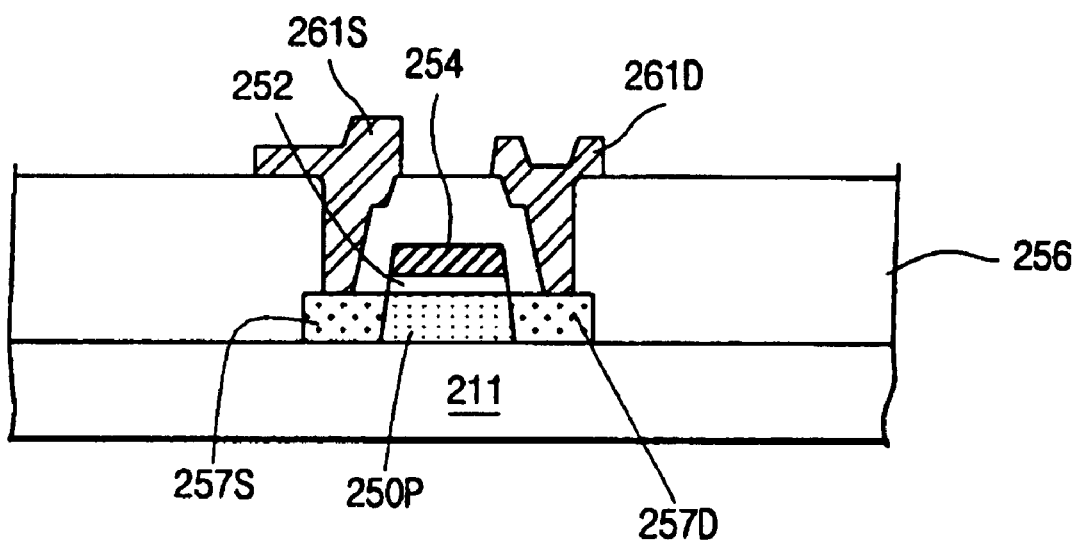

Next, the polycrystalline silicon layer 250P is doped with impurity ions using the gate layer or gate electrode 254 as a mask to define a drain region 257D and a source region 257S, as shown in FIG. 3F. Next, a second insulating layer 256 preferably made of $SiO_2$ is formed to cover the entire substrate 211. The second insulating layer 256 is patterned through preferably a photolithography and etching technique to form a source region contact hole 257 and a drain region contact hole 259, as shown in FIG. 3G. Finally, a drain electrode 261D and a source electrode 261S are formed to contact the drain region 257D and the source region 257S via contact holes 259 and 257, respectively. The type of TFT fabricated by the above-described technique is called a coplanar type TFT.

Figure 4A:
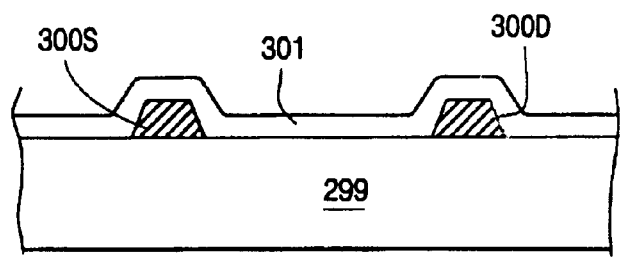
FIGS. 4A to 4H are cross-sectional views showing another example of a method for fabricating a thin film transistor according to the present invention.

A preferred method for fabricating another TFT according to the present invention will be described with reference to FIGS. 4A through 3E.

On the substrate 299 a source electrode 300S and a drain electrode 300D are formed, on which a first insulating layer 301 is deposited. The source and drain electrodes 300S and 300D are preferably double layered films, as shown in FIG. 4A.

Figure 4B:
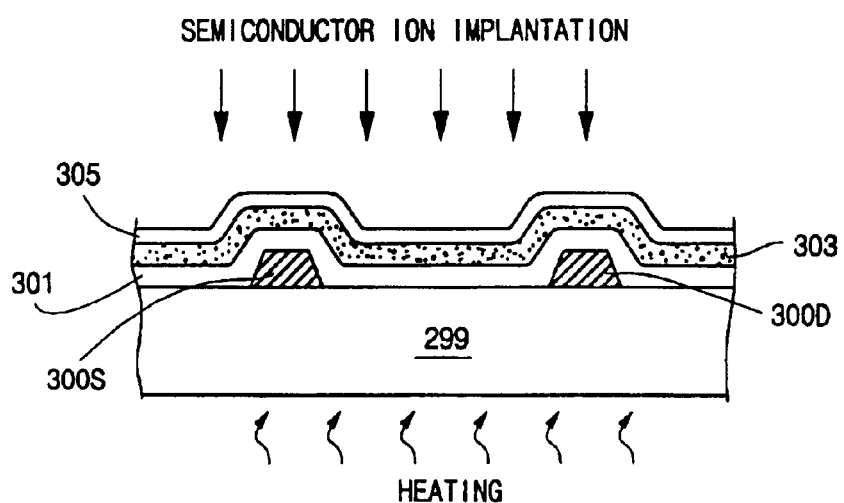

Next, an amorphous silicon layer 303 of amorphous silicon and a second insulating layer 305 of SiOx are formed on the first insulating layer 301. After the deposition, the semiconductor ions having smaller ion size than that of an oxygen ion are implanted into an interface between the amorphous silicon layer 303 and the second insulating layer 305, while the substrate 299 is being heated to about 200 to 500° C., as shown in FIG. 4B. The semiconductor ions for the implantation process are chosen from the group comprising of Si (silicon), Ge (germanium), Te (tellurium), Sb (Antimony), As (Arsenic), Ga (Gallium) or other suitable materials.

Through the implantation process, a substitutional doping is done in the crystal lattices of the amorphous silicon layer 303, and the amorphous silicon layer is converted into a polycrystalline silicon layer 303P.

Figure 4C:
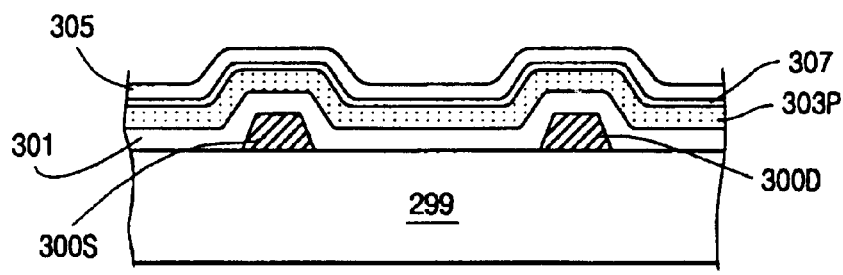

Furthermore, the lower portion of the second insulating layer is converted to an amorphous oxidation layer 307 by the ion implantation, as shown in FIG. 4C. That is, through the ion implantation process the double-layered structure of an amorphous silicon layer 303 and a silicon oxidation layer 305 is converted into a three-layered structure of a polycrystalline silicon layer 303P, an amorphous oxidation layer 307, and a silicon oxidation layer 305. If Si or Ge ions are adapted for the ion implantation process, the amorphous oxidation layer 307 is made of SiOx or SiGeOx.

Figure 4D:
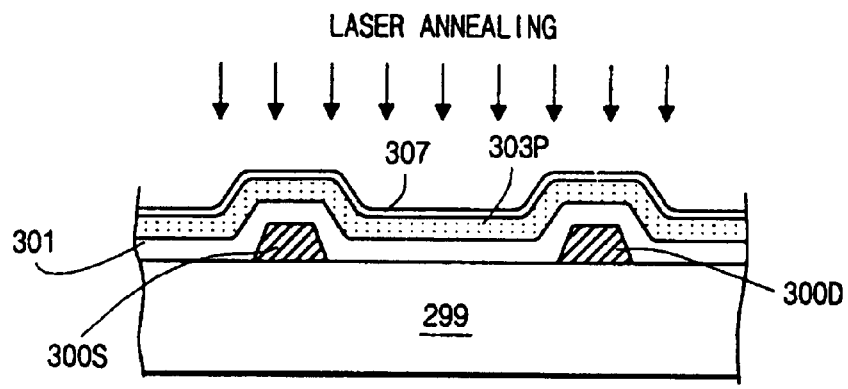

Next, the damaged silicon oxidation layer 305 by the ion implantation is etched, as shown in FIG. 4D. After that, a laser annealing process is performed and the implanted semiconductor ions and the oxygen atoms which were weakly bonded with each other in the amorphous oxidation layer 307 are rearranged. During the process, the amorphous oxidation layer 307 is converted into a gate insulating layer of, for example, $SiO_2$ or $SiGeO_4$.

Figure 4E:
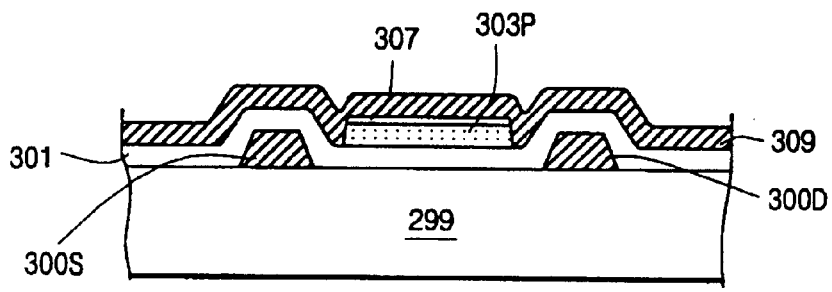
Figure 4F:
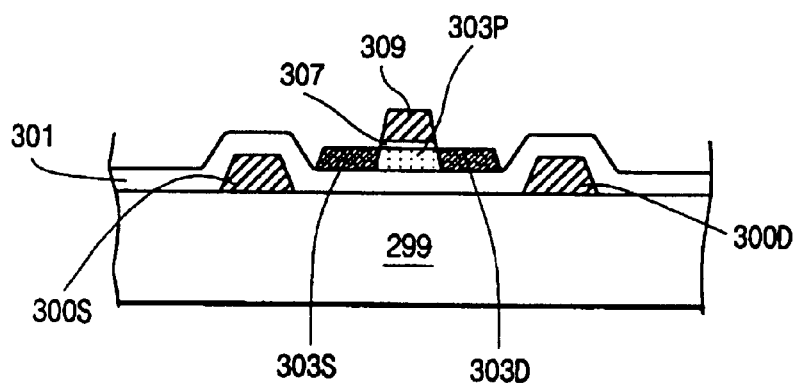

Next, by using a photolithography and etching technique, the polycrystalline silicon layer 303P and the oxidation layer 307 are changed to island shaped structure. Next, a gate electrode layer 309 which can be a single layer or double-layer is formed thereon, as shown in FIG. 4E. Next, the gate electrode layer 309 and the oxidation layer 307 are simultaneously etched through a photolithography or other suitable process. Next, the polycrystalline silicon layer 303P is doped with impurity ions using the gate layer or gate electrode 309 as a mask to define a drain region 303D and a source region 303S, as shown in FIG. 4F.

Figure 4G:
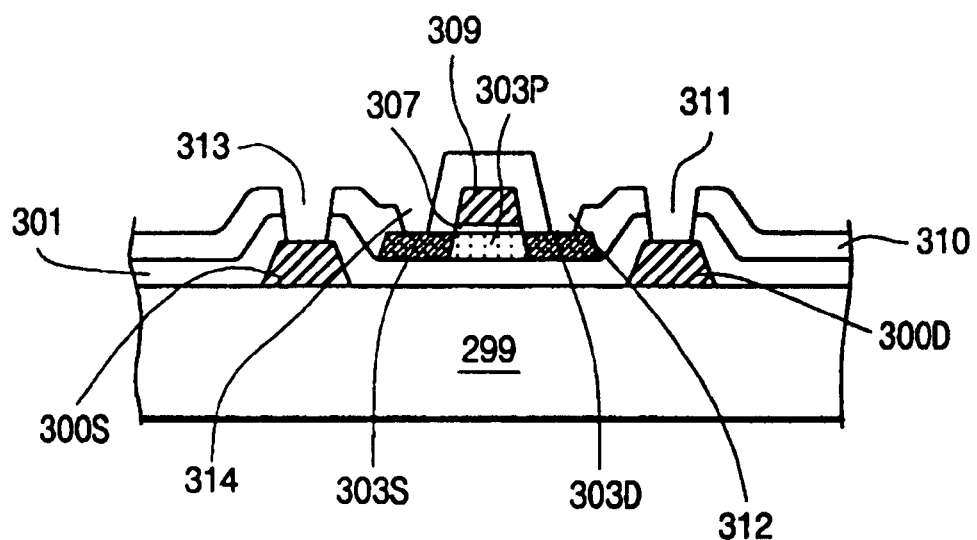
Figure 4H:
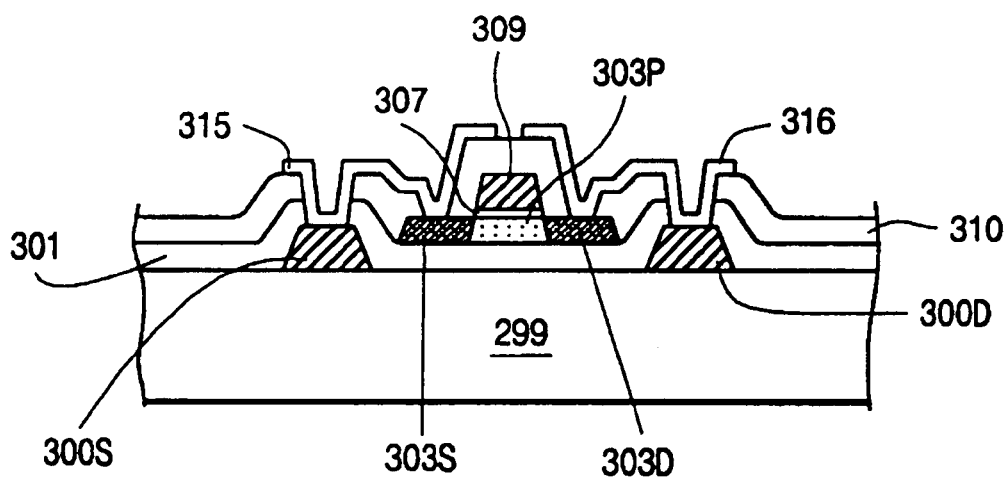

Next, a second insulating layer 310 made of $SiO_2$ is formed to cover the entire substrate 211. The second insulating layer 310 is patterned through a photolithography and etching technique to form a source region contact hole 314, a drain region contact hole 312, a source electrode contact hole 313, and a drain electrode contact hole 312, as shown in FIG. 4G. Finally, a first connecting electrode 315 to connect the source electrode 300S to the source region 303S via the contact holes 313 and 314 and a second connecting electrode 316 to connect the drain electrode 300D to the drain region 303D via the contact holes 311 and 312 are formed. The TFT of this structure is called a buried bus coplanar type TFT.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming a polycrystalline silicon layer, comprising the steps of:
   forming an amorphous silicon layer on a substrate;
   forming a silicon oxidation layer on the amorphous silicon layer; and
   implanting semiconductor ions in the amorphous silicon layer and the silicon oxidation layer while heating the substrate to transform the amorphous silicon layer to the polycrystalline silicon layer and forming an amorphous oxidation layer between the amorphous silicon layer and the silicon oxidation layer.

2. The method of claim 1, wherein during the ion implantation the substrate is heated to a temperature of about 200 to 500° C.

3. The method of claim 1, wherein the ions for the implantation are one of Si (silicon), Ge (germanium), Te (tellurium), Sb (Antimony), As (Arsenic) and Ga (Gallium).

4. The method of claim 1, further comprising the steps of:
   removing the silicon oxidation layer; and
   annealing the amorphous oxidation layer to transform the amorphous oxidation layer into a crystallized oxidation layer.

5. A method for forming a polycrystalline silicon layer, comprising the steps of:
   forming an amorphous silicon layer above a substrate;
   forming an oxidation layer above the amorphous silicon layer; and
   impregnating the oxidation layer with ions to transform the amorphous silicon layer to the polycrystalline silicon layer and forming an amorphous oxidation layer between the interface of the amorphous silicon layer and the oxidation layer.

6. The method of claim 5, wherein while impregnating the oxidation layer with the ions, the substrate is heated to transform the amorphous silicon layer to the polycrystalline silicon layer.

7. The method of claim 6, wherein during impregnating the oxidation layer with the ions, the substrate is heated to a temperature of about 200 to 500° C.

8. The method of claim 5, wherein the ions are one of Si (silicon), Ge (germanium), Te (tellurium), Sb (Antimony), As (Arsenic) and Ga (Gallium).

9. The method of claim 5, wherein the oxidation layer is a silicon oxidation layer.

10. The method of claim 6, wherein the ions are one of Si (silicon), Ge (germanium), Te (tellurium), Sb (Antimony), As (Arsenic) and Ga (Gallium).

11. The method of claim 6, wherein the oxidation layer is a silicon oxidation layer.

12. The method of claim 6, further comprising: forming a buffer layer between the amorphous silicon layer and the substrate.

13. A TFT formed using the method of claim 5.

14. A method of forming a polycrystalline silicon layer comprising:

forming an amorphous silicon layer on a substrate;

forming a silicon oxidation layer on the amorphous silicon layer; and implanting semiconductor ions in the amorphous silicon layer and the silicon oxidation layer without using a mask while heating the substrate to transform the amorphous silicon layer to the polycrystalline silicon layer and forming an amorphous oxidation layer between the amorphous silicon layer and the silicon oxidation layer.

15. The method of claim 14, wherein implanting the semiconductor ions in the amorphous silicon layer and the silicon oxidation lowers the number of grain boundaries.

16. The method of claim 14, wherein during ion implanting, the substrate is heated to a temperature of about 200 to 500° C.

17. The method of claim 14, wherein the ions including a material selected from the group consisting of Si, Ge, Te, Sb, As, and Ga.

18. The method of claim 14, further comprising:

removing the silicon oxidation layer; and annealing the amorphous oxidation layer to transform the amorphous oxidation layer into a crystallized oxidation layer.

* * * * *